United States Patent
Fujisawa

(10) Patent No.: US 6,858,513 B2
(45) Date of Patent: Feb. 22, 2005

(54) METHOD FOR MANUFACTURING A SEMICONDUCTOR DEVICE WITH MIS CAPACITORS WITH DIELECTRIC FILM IN COMMON

(75) Inventor: Tomotaka Fujisawa, Tokyo (JP)

(73) Assignee: Sony Corporation, Tokyo (JP)

(*) Notice: Subject to any disclaimer, the term of this patent is extended or adjusted under 35 U.S.C. 154(b) by 65 days.

(21) Appl. No.: 10/327,834

(22) Filed: Dec. 23, 2002

(65) Prior Publication Data

US 2003/0127675 A1 Jul. 10, 2003

Related U.S. Application Data

(62) Division of application No. 09/937,358, filed as application No. PCT/JP01/00458 on Jan. 24, 2001, now Pat. No. 6,649,958.

(30) Foreign Application Priority Data

Jan. 24, 2000 (JP) .................... P2000-014288

(51) Int. Cl.[7] .................................................. H01L 21/20
(52) U.S. Cl. ................................................... 438/394
(58) Field of Search ......................................... 438/394

(56) References Cited

U.S. PATENT DOCUMENTS 4,466,177 A * 8/1984 Chao ........................... 438/251
4,914,497 A * 4/1990 Kondo ......................... 257/296
5,858,850 A * 1/1999 Gomi .......................... 438/314

FOREIGN PATENT DOCUMENTS

| JP | 63-177454  |   | 7/1988 |
| JP | 01 140653  |   | 6/1989 |
| JP | 01-235364  |   | 9/1989 |
| JP | 10-173063  | * | 6/1998 |
| JP | 11-040753  |   | 2/1999 |

* cited by examiner

Primary Examiner—Howard Weiss
(74) Attorney, Agent, or Firm—Sonnenschein, Nath & Rosenthal LLP

(57) ABSTRACT

A semiconductor device having an MIS capacitor having a low capacitance value and an MIS capacitor having a high capacitance value formed on the same substrate, and a manufacturing method thereof. The first MIS capacitor consists of a lower conductive material region formed on the substrate, a multilayer dielectric film consisting of a first insulating film, serving as both an interlayer insulating film and a dielectric film, and a second insulating film serving as a dielectric film of the second MIS capacitor, and an upper conductive material film, and the capacitance of the first MIS capacitor is determined by an area of the dielectric film formed by the second insulating film.

2 Claims, 4 Drawing Sheets

METHOD FOR MANUFACTURING A SEMICONDUCTOR DEVICE WITH MIS CAPACITORS WITH DIELECTRIC FILM IN COMMON

The present application claims priority to Japanese Application No. P2000-014288, filed Jan. 24, 2000 and PCT/JP01/00458, filed Jan. 24, 2001, and is a divisional of U.S. application Ser. No. 09/937,358, filed Feb. 11, 2002, now U.S. Pat. No. 6,649,958, all of which are incorporated herein by reference to the extent permitted by law.

TECHNICAL FIELD

The present invention relates to a semiconductor device and a semiconductor device manufacturing method, and more specifically relates to a semiconductor device comprising a plurality of insulator capacitors and a manufacturing method thereof.

BACKGROUND ART

A conventional example of an insulator capacitor (to be referred to as "MIS capacitor" hereinafter) will be described with reference to FIG. 4. FIG. 4 shows an MIS capacitor device formed in, for example, a bipolar IC. For example, in FIG. 4, an N type epitaxial layer 122 is formed on a P type semiconductor substrate 121, and a silicon oxide layer or so-called LOCOS 123 formed by local oxidation of silicon and a device isolation diffusion layer 124 consisting of a P type diffusion layer and formed below the LOCOS 123, both of which layers become a device isolation region, are formed on the epitaxial layer 122. The device isolation diffusion layer 124 is formed to reach the semiconductor substrate 121. An N type semiconductor region 113 doped with N type impurities is formed on the epitaxial layer 122 defined by the device isolation region. A conventional MIS capacitor 101 is constituted by forming an opening portion 127 in a first interlayer insulating film 126 formed on a surface including a portion on the semiconductor region 113 with the semiconductor region 113 serving as a lower electrode, forming an insulating film (or a so-called dielectric film) 111 on the semiconductor region 113 facing this opening portion 127, and forming an upper electrode 112 of a polysilicon film on the insulating film 111. Further, a second interlayer insulating film 128 is formed to cover the upper electrode 112, a wiring 130 connected to the upper electrode 112 through an opening portion formed at a position in the second interlayer insulating film 128, which position corresponds to the upper electrode 112, is formed, and a wiring 131 connected to the lower electrode 113 through an opening portion formed at positions in the first and second interlayer insulating films 126 and 128, which positions correspond to the lower electrode 113, is formed.

In case of this MIS capacitor 101, the effective area thereof is determined according to the area of the opening portion 127 in the first interlayer insulating film 126, and the capacitance value thereof is determined according to the property and thickness of the insulating film (or dielectric film) 111 provided in the opening portion 127. Actually, however, even on the peripheral portion of the opening portion 127, a parasitic capacitance is generated between the upper electrode 112 and the lower electrode 113 with the first interlayer insulating film 126 and the insulating film (or dielectric film) 111 put between the upper and lower electrodes 112 and 113. This parasitic capacitance is added to an overall capacitance value proportionally to the peripheral length of the upper electrode 112 and that of the insulating film (or dielectric film) 111 on the peripheral portion of the opening portion 127.

Meanwhile, in case of the conventional semiconductor device, the applicable capacitance value range of the MIS capacitor is often in the order of 1 pF or more. It has hardly been assumed that capacitance values particularly in the applicable range of 100 fF or less are used. In particular, the required performance of the ordinary MIS capacitor is that the MIS capacitor has a capacitance value used frequently, i.e., a capacitance value per unit area as high as possible in a region in the order of pF to nF with a view of reducing the area of a circuit, a small area, high accuracy and high reliability. To meet this requirement, with an ordinary MIS capacitor formation technique, a silicon nitride ($Si_3N_4$) film [film thickness: about 20 nm to 50 nm] having a high dielectric constant and advantageous in reliability is often used as the dielectric film. The capacitance value per unit area of the MIS capacitor having the structure stated above is about 1 $fF/\mu m^2$ to 3 $fF/\mu m^2$.

In recent years, as signal processing is accelerated, the frequency of, for example, the circuit for an optical pickup of an optical disk (CD, DVD or the like) or a so-called PDIC (photodiode integrated circuit) becomes higher and an MIS capacitor in a region having a capacitance value of 100 fF or less is required as an MIS capacitor in the circuit.

Using the circuit configuration of the PDIC shown in FIG. 5, an example of using the MIS capacitor in a region having a capacitance value of 100 fF or less will be described. As shown in FIG. 5, an ordinary PDIC 140 consists of a photodiode 141 serving as a current source and a current-voltage conversion circuit (or so-called IV amplifier) 142. The photodiode 141 equivalently consists of a junction capacitance $C_{PD}$ and a photoelectric current $i_{PD}$. The current-voltage conversion circuit 142 has a differential amplifier A. A predetermined bias voltage Vc is applied to a non-inverting input terminal of the differential amplifier A and a cathode of the photodiode 141 is connected to a inverting input terminal of the differential amplifier A through a wiring 143. A resistance $R_t$ and a capacitance $C_t$ are connected in parallel between the inverting input terminal of the differential amplifier A and the output terminal $t_{OUT}$ thereof from which an output voltage $v_O$ is obtained. Reference symbol $C_H$ denotes a wiring capacitance.

The frequency of the current-voltage conversion circuit 142 is expressed by Mathematical Expression 1 using the resistance $R_t$ and the capacitance $C_t$ shown in FIG. 5.

$$f=1/(2\pi \cdot R_t \cdot C_t) \qquad \text{[Mathematical Expression 1]}$$

For example, if an output voltage $v_O$ of 300 mV is necessary while the light receiving sensitivity S of the photodiode is 0.4 A/W and laser power P is 10 $\mu W$, the following relationship is obtained:

$$R_t = v_O/i_{PD} = 300e^{-3}/(0.4 \times 10e^{-6}) = 75000\Omega = 75\ k\Omega$$

As the read/write rates of optical disks (e.g., CD and DVD) are accelerated, demand for an improvement in the frequency characteristics of the PDIC 140 arises. For example, the PDIC 140 is required to have a cutoff frequency $f_c$ of about 100 MHz of a 10 times speed DVD.

If it is assumed that the cutoff frequency $f_c$ of the PDIC 140 is rate-controlled by the frequency characteristics of the current-voltage conversion circuit 142, the required MIS capacitance $C_t$ is obtained using the above [Mathematical Expression 1] as follows:

$$100\ MHz = 1/(2\pi \cdot 75k\Omega \cdot C_t)$$

$$C_t = 2.1e^{-14}[F] = 21[fF]$$

However, if the conventional MIS capacitor 101 is used, the ratio of a parasitic capacitance on the peripheral portion of the MIS capacitor to a capacitance formed by the effective area (or the area of the so-called opening portion 127)

suddenly increases in a region having a capacitance value of 1 pF or less which is not supposed to fall in the applicable range. In other words, if the capacitance value is about 1 pF or less, the influence of the parasitic capacitance on the peripheral portion increases according to the increase of the peripheral length to area ratio of the MIS capacitor. Following this, the deterioration of the unevenness of the MIS capacitor resulting from the unevenness of the parasitic capacitance stated above (so-called controllability of capacitance value) becomes conspicuous. Taking an MIS capacitor in a currently conducted manufacturing process as an example, the unevenness of the MIS capacitor with a capacitance value of 10 fF is approximately ±50% (see a second MIS capacitor curve II shown in FIG. 2).

Under these circumstances, it is necessary to develop a semiconductor device having an MIS capacitor having a high capacitance value (e.g., in a region having a capacitance value exceeding 100 fF) and an MIS capacitor having a low capacitance value (e.g., in a region having a capacitance value of 100 fF or less) mounted on a common semiconductor substrate. In the development of the semiconductor device of this type, it is demanded that the unevenness of capacitance values is suppressed to be little within a practicable range while suppressing the occupied area of each MIS capacitor within a predetermined allowable range on an integrated circuit, and that the semiconductor device of this type can be manufactured without increasing the number of manufacturing steps.

DISCLOSURE OF THE INVENTION

The present invention provides a semiconductor device and a semiconductor device manufacturing method made to solve the above-stated disadvantages.

A semiconductor device according to the present invention is a semiconductor device comprising a first insulator capacitor formed on a substrate; and a second insulator capacitor formed on the substrate, and having a higher capacitance than a capacitance of the first insulator capacitor, wherein the first insulator capacitor is constituted out of a first conductive material region formed on the substrate; a first insulating film serving as both an interlayer insulating film and a dielectric film of the first insulator capacitor, and formed on the first conductive material region; a second insulating film serving as a part of the dielectric film of the first insulator capacitor and a dielectric film of the second insulator capacitor, and formed on the first insulating film; and a conductive material film formed on the second insulating film, and the capacitance of the first insulator capacitor is determined by a formation area of the dielectric film first conductive material film.

The first insulating film can be formed out of a single or a plurality of silicon oxide layers, and the second insulating film is formed out of a silicon nitride layer.

A capacitance value of the first insulator capacitor can be set at not more than 100 fF.

Also, a capacitance value of the first insulator capacitor can be set at not more than 100 fF, and a capacitance value of the second insulator capacitor can be set at a value exceeding 100 fF.

In the above-stated semiconductor device, the dielectric film of the first insulator capacitor is constituted out of the first insulating film and the second insulating film to thereby make the dielectric film thick, and the second insulating film is formed out of, for example, a silicon nitride film and the first insulating film is formed out of, for example, a silicon oxide film having a lower dielectric constant than that of the second insulating film, whereby a capacitance value per unit area is lowered, an MIS capacitor area is increased and a peripheral length to area ratio in a low capacitance region is made low. By determining the capacitance value of the first insulator capacitor according to the area of the upper electrode (i.e., the dielectric film), a parasitic capacitance generated in the peripheral portion is reduced per se. The first insulator capacitor is constituted as stated above, whereby the first insulator capacitor becomes a highly accurate insulator capacitor corresponding to a low capacitance region of about 10 fF to 100 fF. Accordingly, the first insulator capacitor is capable of suppressing the unevenness of capacitance values within a practical range while suppressing its occupied area to be small within a predetermined allowable range on an integrated circuit, and capable of corresponding to the low capacitance region having a required capacitance value of 100 fF or less. Besides, the first insulator capacitor is highly accurate and excellent in reliability. In addition, since the silicon nitride film used for the conventional MIS capacitor is used as a part of the dielectric film, it is expected that the first insulator capacitor has a film property equivalent to or higher than that of the conventional MIS capacitor which film property influences the reliability of the MIS capacitor.

According to the present invention, the semiconductor device stated above is constituted so that the first conductive material region serving as a lower electrode of the first insulator capacitor and the second conductive material region serving as a lower electrode of the second insulator capacitor are formed in a common conductive material region; a part of the dielectric film of the first insulator capacitor and an insulating film having an opening portion determining the capacitance of the second insulator capacitor are formed by the first insulating film; a remaining part of the dielectric film of the first insulator capacitor and the dielectric film of the second insulator capacitor are formed by the second insulating film; and an upper electrode of the first insulator capacitor and an upper electrode of the second insulator capacitor are formed by a common conductive material film.

By thus constituting the semiconductor device, it is possible to manufacture a semiconductor device having the first insulator capacitor having a low capacitance value of 100 fF or less and the second insulator capacitor having a high capacitance value exceeding 100 fF provided on a common substrate, without increasing the number of manufacturing steps.

A semiconductor device manufacturing method according to the present invention is a method of manufacturing a semiconductor device having a first insulator capacitor and a second insulator capacitor formed on a semiconductor substrate, the first insulator capacitor and the second insulator capacitor having different unit capacitance values, the method comprising the steps of: doping the semiconductor substrate with impurities, and forming a first conductive material region and a second conductive material region; forming a first insulating film on the first conductive material region and the second conductive material region, the first insulating film serving as both an interlayer insulating film and a dielectric film of the first insulator capacitor; forming an opening portion of the first insulating film on the second conductive material region; forming a second insulating film on the first insulating film and in the opening portion, the second insulating film serving as both a part of the dielectric film of the first insulator capacitor and a dielectric film of the second insulator capacitor; and forming a conductive material film on the second insulating film, the conductive material film serving as an upper electrode of the first insulator capacitor and an upper electrode of the second insulator capacitor, and wherein a capacitance of the first insulator capacitor is determined by a formation area of the conductive material film.

The first insulating film can be formed out of a single or a plurality of silicon oxide films, and the second insulating film can be formed out of a silicon nitride film.

According to the semiconductor device manufacturing method stated above, the dielectric film of the first insulator capacitor is formed out of the first insulating film and the second insulating film to thereby make the dielectric film thick, and the second insulating film is formed out of, for example, a silicon nitride film and the first insulating film is formed out of, for example, a silicon oxide film having a lower dielectric constant than that of the second insulating film, whereby a capacitance value per unit area is lowered, an MIS capacitor area is increased and a peripheral length to area ratio in a low capacitance region is made low. Further, by determining the capacitance value according to the area of the upper electrode (or the dielectric film), a parasitic capacitance generated in the peripheral portion is reduced per se. By employing the above-stated manufacturing method, a highly accurate insulator capacitor corresponding to a low capacitance region of about 10 fF to 100 fF is manufactured. Accordingly, the first insulator capacitor corresponding to the low capacitance region having a required capacitance value of 100 fF or less can be formed while ensuring high accuracy and excellent reliability.

Moreover, since the silicon nitride film used for the conventional MIS capacitor is used as a part of the dielectric film, it is expected that the first insulator capacitor has a film property equivalent to or higher than that of the conventional MIS capacitor which film property influences the reliability of the MIS capacitor. Besides, it is possible to form the MIS capacitor from a normal bipolar transistor process without increasing the number of manufacturing steps.

Since there is no need to add a new step to the step of forming the second insulator capacitor so as to form the first insulator capacitor, no load is given to the process.

For the above-stated reasons, two types of insulator capacitor having different structures can be separately used for capacitance regions for which the respective capacitors are responsible, i.e., can be used in a region having a value exceeding 100 fF and a region having a value of 100 fF or less, respectively. Thus, compared with a conventional case, it is possible to provide highly accurate insulator capacitors in a wide range.

BEST MODE FOR CARRYING OUT THE INVENTION

A mode for carrying out the invention according to the semiconductor device of the present invention will be described with reference to a schematic, sectional block diagram shown in FIG. 1. By way of example, FIG. 1 shows an insulator capacitor, i.e., a so-called MIS capacitor formed in an existing bipolar IC.

Figure 1:
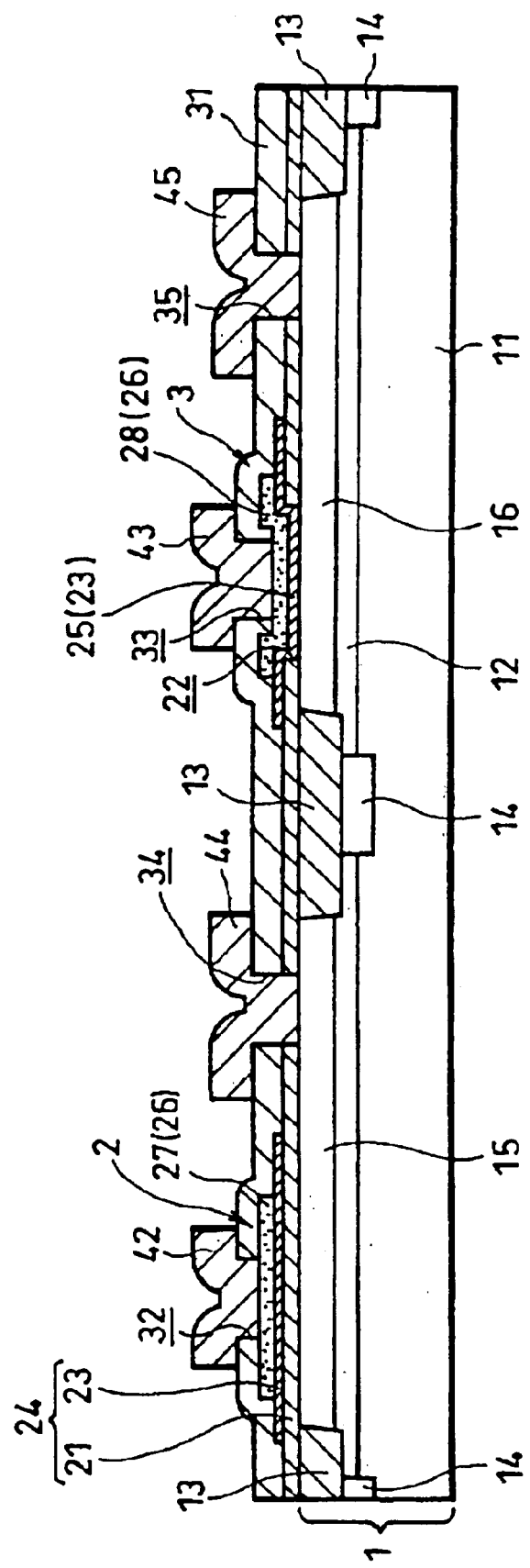
FIG. 1 is a schematic block diagram showing a mode for carrying out the invention according to the semiconductor device of the present invention.

As shown in FIG. 1, an N type epitaxial layer 12 is formed on a P type semiconductor substrate 11. A LOCOS 13 and a device isolation diffusion layer 14 formed out of a P type diffusion layer and provided below the LOCOS 13, both of which serve as a device isolation region, are formed on this epitaxial layer 12. This device isolation diffusion layer 14 is formed to reach the semiconductor substrate 11. Also, on the epitaxial layer 12 defined by the above device isolation region, a first conductive material region 15 and a second conductive material region 16 doped with N type impurities are formed out of an $N^+$ type diffusion layer having a diffusion depth from a substrate 1 Xj of about 0.5 μm, a density of $1\times10^{18}$ impurities/cm$^3$ to $1\times10^{20}$ impurities/cm$^3$. This first conductive material region 15 becomes a lower electrode of the first MIS capacitor and the second conductive material region 16 becomes a lower electrode of the second MIS capacitor. The substrate 1 is thus constituted.

A first insulating film 21 serving as an interlayer insulating film and a part of the dielectric film of the first insulator capacitor (to be referred to as "first MIS capacitor" hereinafter) is formed out of, for example, a silicon oxide film having a thickness of about 150 nm on the surface of the substrate 1 (or epitaxial layer 12). It is noted that the silicon oxide film may be replaced by a plurality of layers of silicon oxide films obtained by forming a thermal oxide film to have a thickness of, for example, about 50 nm by thermal oxidation at about 900° C. and then forming a silicon oxide film to have a thickness of, for example, about 100 nm by the chemical vapor deposition method in view of the reliability of a film property and the stability of a silicon interface.

An opening portion 22 is formed in the first insulating film 21 in a region in which the second insulator capacitor (to be referred to as "second MIS capacitor" hereinafter) is formed. A second insulating film used as a part of dielectrics of the first MIS capacitor and the dielectric film of the second MIS capacitor is formed out of, for example, a silicon nitride film 23 having a thickness of about 40 nm on the first insulating film 21 and in the inner surface of the opening portion 22. This second insulating film 23 is patterned to have a predetermined magnitude to function as a dielectric film. In this way, a dielectric film 24 of the first MIS capacitor is formed out of the first insulating film 21 and the second insulating film 23. Also, the dielectric film 25 of the second MIS capacitor is formed out of the second insulating film 23. As a result, the reliability of the film property of the first MIS capacitor is at least equivalent to or higher than the reliability of the film property of the second MIS capacitor.

Further, a conductive material film 26 which becomes an upper electrode 27 is formed on the second insulating film 23 in the region in which the above-stated first MIS capacitor is formed, by depositing, for example, polysilicon with a thickness of about 200 nm. Also, a conductive material film 26 which becomes an upper electrode 28 is formed on the second insulating film 23 in the region in which the above-stated second MIS capacitor is formed, by depositing, for example, polysilicon by a thickness of about 200 nm.

That is to say, the first MIS capacitor 2 is constituted out of the first conductive material region 15, the first insulating film 21 (or silicon oxide film), the second insulating film 23 (silicon nitride film) and the upper electrode 27, while the second MIS capacitor 3 is constituted out of the second conductive material region 16, the second insulating film 23 (or silicon nitride film) and the upper electrode 28. It is noted that polysilicon films which resistivity is reduced by injecting impurities by means of the ion implantation technique or the like are employed as those constituting the upper electrodes 27 and 28, respectively. The effective area of the first MIS capacitor 2 is determined according to the area of the upper electrode 27. In addition, the effective area of the second MIS capacitor 3 is determined according to the opening area of the opening portion 22. It is noted that the polysilicon films can also serve as normally employed polysilicon resistances or the like.

Moreover, a silicon oxide film 31, serving as an interlayer insulating film, is formed on the first insulating film 21 to have a thickness of, for example, about 300 nm, so as to cover the first and second MIS capacitors 2 and 3. Opening portions 32 and 33 are formed in the silicon oxide film 31 on the upper electrodes 27 and 28, respectively and opening portions 34 and 35 reaching the first and second conductive material regions 15 and 16 are formed, respectively.

Furthermore, wirings 42 and 43 connected to the upper electrodes 27 and 28 through the opening portions 32 and 33 are formed, respectively, and wirings 44 and 45 connected to the first and second conductive material regions 15 and 16 through the opening portions 24 and 35 are formed, respectively. During the formation, the wiring 42 is formed inwardly compared with the upper electrode 27, whereby it is possible to minimize the influence of a parasitic capacitance due to the wiring 42. Each of the wirings 44 and 45 for taking out the lower electrodes is set to have a minimum width in a design rule, whereby it is possible to minimize the influence of a parasitic capacitance.

As stated so far, a semiconductor device is constituted so that two types of MIS capacitors having different capacitance values per unit area, i.e., the second MIS capacitor (or MIS capacitor using the silicon nitride film of 40 nm in thickness as the dielectrics) 3 having a conventional structure of a capacitance value per unit area of 1.6 fF/$\mu$m$^2$ and the first MIS capacitor (or MIS capacitor using the silicon oxide film of 150 nm in thickness and the silicon nitride film of 40 nm in thickness as the dielectrics) 2 having a capacitance value per unit area of 0.2 fF/$\mu$m$^2$ are mounted on the same substrate.

In case of the above-stated semiconductor device, the dielectric film 24 of the first insulator capacitor 2 is constituted out of the first insulating film (or silicon oxide film) 21 and the second insulating film (or silicon nitride film) 23 to thereby make the dielectric film 24 thick. In addition, the second insulating film 23 is formed out of, for example, the silicon nitride film and the first insulating film 21 is formed out of the silicon oxide film having a lower dielectric constant than that of the second insulating film 23, whereby a capacitance value per unit area is lowered, an MIS capacitor area is increased and a peripheral length to area ratio in a low capacitance region is made low. Also, the capacitance value of the first MIS capacitor 2 is determined according to the area of an electrode on one side (i.e., the conductive material film 26 serving as the upper electrode 27), whereby a parasitic capacitance generated on the peripheral portion is reduced per se. By employing such a structure, a highly accurate MIS capacitor corresponding to a low capacitance region of about 10 fF to 100 fF is provided.

Additionally, since the silicon nitride film used for the conventional MIS capacitor is used as a part of the dielectric film 24, the film property of the dielectric film 24, which influences the reliability of the first MIS capacitor 2, is expected to be equivalent to or higher than that of the conventional MIS capacitor.

Figure 2:
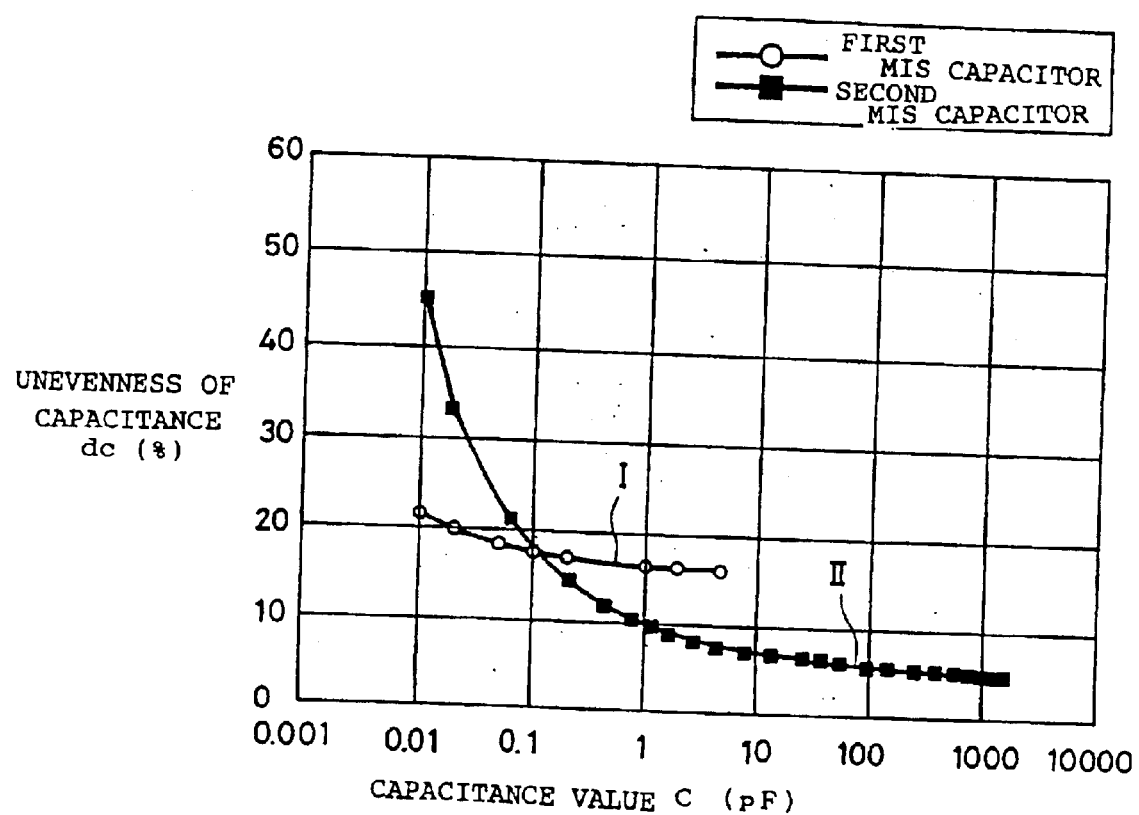
FIG. 2 is a chart showing the relationships between the unevenness of the capacitance values of the first and second MIS capacitors, respectively.

Next, the relationship between the capacitance values of the first and second MIS capacitors 2 and 3 and the unevenness thereof will be described with reference to FIG. 2. In FIG. 2, the vertical axis indicates the unevenness of the capacitance and the horizontal axis indicates the capacitance value of each MIS capacitor. The curve I indicates the first MIS capacitance, and the curve II indicates the second MIS capacitance.

As shown in FIG. 2, if it is assumed that process unevenness (such as the unevenness of film thicknesses/unevenness of patterning) relative to the first MIS capacitor is equivalent to process unevenness relative to the second MIS capacitor, the unevenness of the first MIS capacitor 2 is obviously about 22% to 18% in a region of capacitance calculated values of 10 fF to 100 fF, indicating that the accuracy of the first MIS capacitor 2 is superior to the accuracy of the second MIS capacitor 3.

Here, the first MIS capacitor 2 is used in a region having a capacitance value equal to or lower than a predetermined capacitance value and the second MIS capacitor 3 is used in a region having a capacitance value exceeding the predetermined capacitance value. This predetermined capacitance value is determined based on a capacitance value at which the expected unevenness of capacitances resulting from the unevenness of the manufacturing processes or the like of the first MIS capacitor 2 is identical to that of the second MIS capacitor 3. In case of FIG. 2, such a predetermined capacitance value is 100 fF. That is, the first MIS capacitor 2 is used in a region having a capacitance value of 100 fF or less and the second MIS capacitor 3 is used in a region having a capacitance value exceeding 100 fF.

Next, a mode for carrying out the invention according to the semiconductor device manufacturing method of the present invention will be described with reference to cross-sectional views of manufacturing steps shown in FIG. 3. By way of example, FIG. 3 shows an MIS capacitor formed in an existing bipolar IC. It is noted that the same constituent elements as those described with reference to FIG. 1 are denoted by the same reference symbols.

Figure 3A:
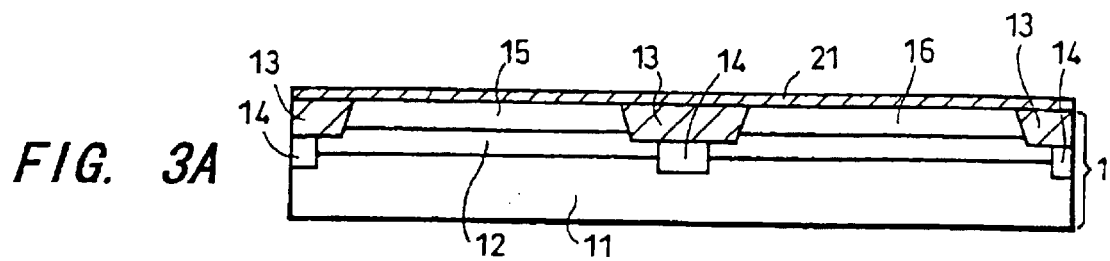
FIG. 3A is a cross-sectional view for manufacturing steps showing the mode for carrying out the invention according to the semiconductor manufacturing method of the present invention.

As shown in FIG. 3A, an N type epitaxial layer 12 is formed on a P type semiconductor substrate 11. Then, a device isolation region is constituted by forming, for example, a LOCOS 13 and forming, below the LOCOS 13, a device isolation diffusion layer 14 of a P type diffusion layer. Also, the N type epitaxial layer 12 is doped with N type impurities, thereby forming the first conductive material region 15 and the second conductive material region 16 of N⁺ type each having a diffusion depth from a substrate 1 Xj of about 0.5 µm and a density of $1 \times 10^{18}$ to $10^{20}$ impurities/cm³. This first conductive material region 15 becomes the lower electrode of the first MIS capacitor and the second conductive material region 16 becomes the lower electrode of the second MIS capacitor. The substrate 1 is thus constituted.

Next, the first insulating film 21 which becomes an interlayer insulating film and a part of the dielectric film of the first insulator capacitor (to be referred to as "first MIS capacitor" hereinafter) is formed out of, for example, a silicon oxide film having a thickness of about 150 nm on the substrate 1 (epitaxial layer 12). It is noted that the silicon oxide film may be replaced by a plurality of layers having a structure in which a thermal oxide film formed by thermal oxidation at about 900° C. is formed to have a thickness of, for example, about 50 nm and then a silicon oxide film is formed to have a thickness of, for example, about 100 nm by the chemical vapor phase deposition method.

Figure 3B:
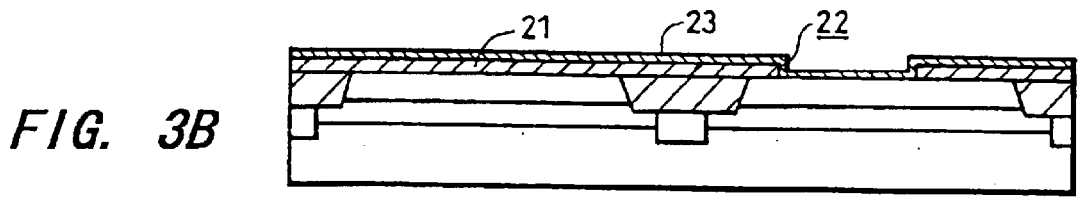
FIG. 3B is a cross-sectional view for manufacturing steps showing the mode for carrying out the invention according to the semiconductor manufacturing method of the present invention.

Next, as shown in FIG. 3B, using ordinary lithographic technique and etching technique, an opening portion 22 is formed in the first insulating film 21 in a region in which the second insulator capacitor (to be referred to as "second MIS capacitor" hereinafter) is formed. Then, the second insulating film 23 used as a part of the dielectric film of the first MIS capacitor and the dielectric film of the second MIS capacitor is formed out of, for example, a silicon nitride film having a thickness of about 40 nm on the first insulating film 21 and on the inner surface of the opening portion 22.

Figure 3C:
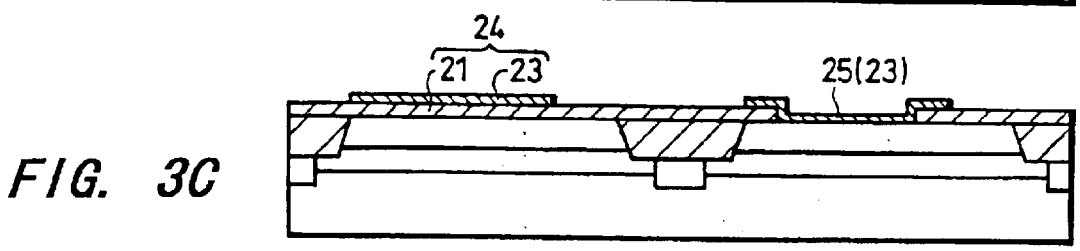
FIG. 3C is a cross-sectional view for manufacturing steps showing the mode for carrying out the invention according to the semiconductor manufacturing method of the present invention.

Next, as shown in FIG. 3C, using the ordinary lithographic technique and etching technique, the second insulating film 23 is patterned. Then, the dielectric film 24 of the first MIS capacitor is formed out of the first insulating film (or silicon oxide film) 21 and the second insulating film (or silicon nitride film) 23. Also, the dielectric film 25 of the second MIS capacitor becomes the second insulating film (or silicon nitride film) 23. As a result, the reliability of the film property of the first MIS capacitor becomes at least equivalent to or higher than the dielectric constant of the second MIS capacitor.

Figure 3D:
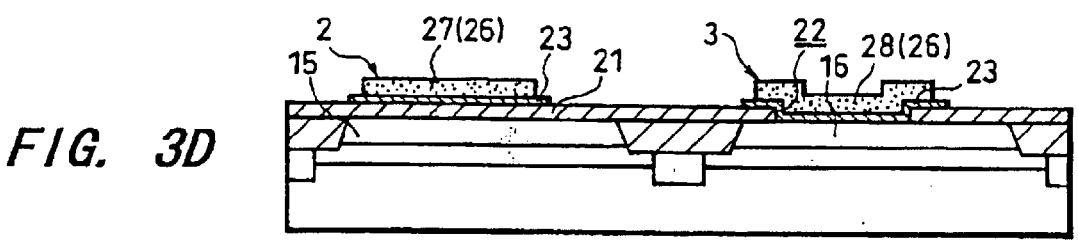
FIG. 3D is a cross-sectional view for manufacturing steps showing the mode for carrying out the invention according to the semiconductor manufacturing method of the present invention.

Next, as shown in FIG. 3D, a conductive material film 26 is formed by depositing, for example, polysilicon by a thickness of about 200 nm by the chemical vapor phase deposition method. Then, using the known lithographic technique and etching technique, the conductive material film 26 is patterned to thereby form upper electrodes 27 and 28 of the respective MIS capacitors.

Namely, the first MIS capacitor 2 is constituted out of the first conductive material region 15, the first insulating film (or silicon oxide film) 21, the second insulating film (or silicon nitride film) 23 and the upper electrode 27, while the second MIS capacitor 3 is constituted out of the second conductive material region 16, the second insulating film (or silicon nitride film) 23 and the upper electrode 28.

It is noted that polysilicon films which resistivity is reduced by injecting impurities by the ion implantation technique or the like are used as those constituting the respective upper electrodes 27 and 28. In addition, the effective area of the first MIS capacitor 2 is determined according to the area of the upper electrode 27 and the effective area of the second MIS capacitor 3 is determined according to the opening area of the opening portion 22. It is noted that the above-stated polysilicon films can also serve as normally employed polysilicon resistances or the like.

Figure 3E:
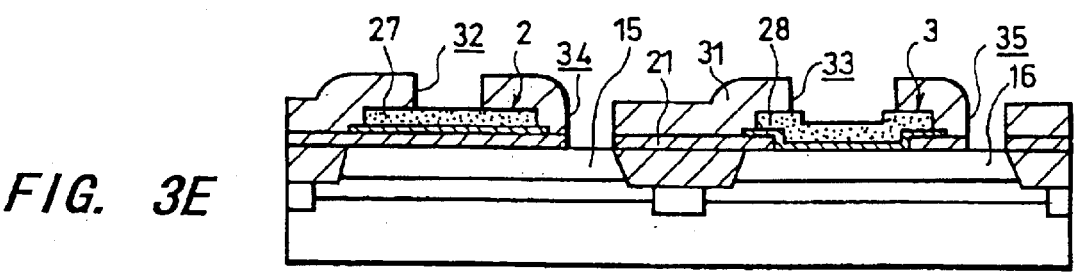
FIG. 3E is a cross-sectional view for manufacturing steps showing the mode for carrying out the invention according to the semiconductor manufacturing method of the present invention.

Next, as shown in FIG. 3E, a silicon oxide film 31 which becomes an interlayer insulating film is formed on the first insulating film 21 to have a thickness of, for example, about 300 nm so as to cover the first and second MIS capacitors 2 and 3. Following this, using the lithographic technique and the etching technique, opening portions 32 and 33 are formed in the silicon oxide film 31 on the upper electrodes 27 and 28, respectively and opening portions 34 and 35 reaching the first and second conductive material regions 15 and 16 are formed, respectively.

Figure 3F:
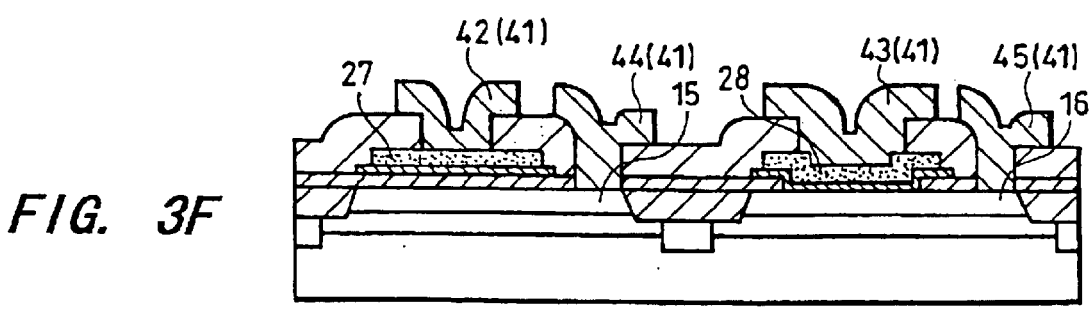
FIG. 3F is a cross-sectional view for manufacturing steps showing the mode for carrying out the invention according to the semiconductor manufacturing method of the present invention.
Figure 4:
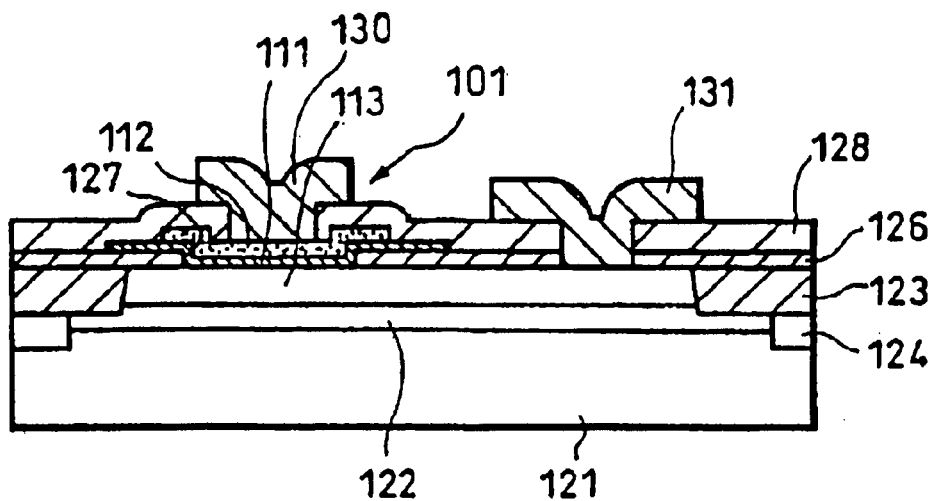
FIG. 4 is a schematic, sectional block diagram showing a conventional MIS capacitor.
Figure 5:
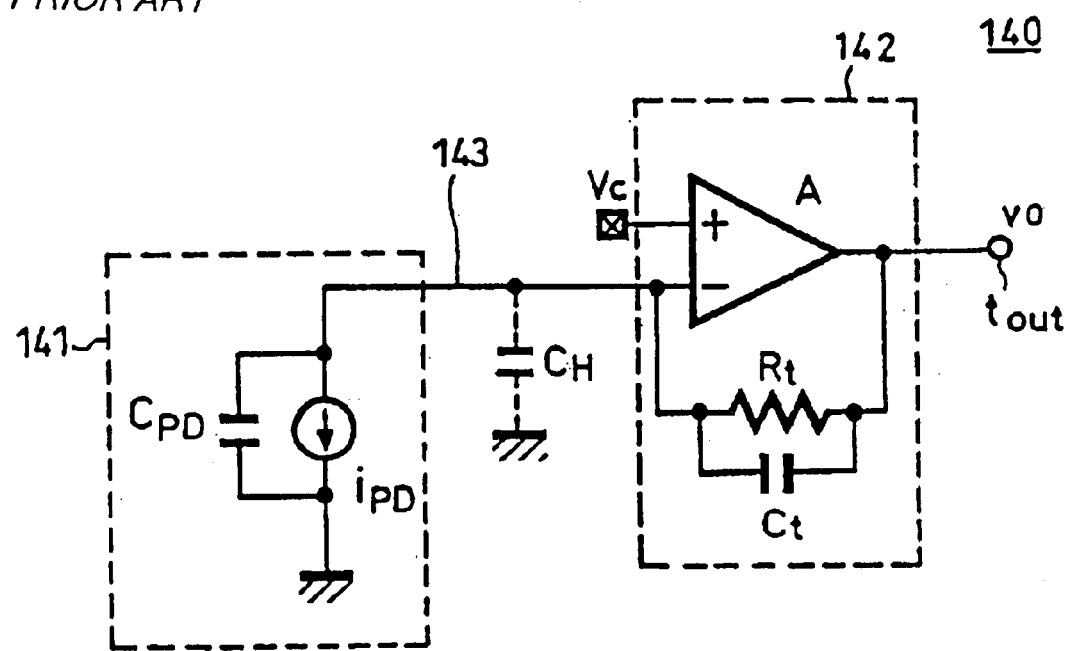
FIG. 5 is a schematic circuit diagram showing the circuit configuration of a PDIC.

Next, as shown in FIG. 3F, using a film formation technique such as sputtering or chemical vapor phase deposition method, a wiring layer 41 is formed out of, for example, an aluminum based metallic film. If necessary, it is preferable that a barrier metal layer or an adhesion layer is formed. Then, using the lithographic technique, reactive ion etching technique or the like, the wiring layer 41 is processed to thereby form wirings 42 and 43 connected to the upper electrodes 27 and 28, respectively, and wirings 44 and 45 connected to the first and second conductive material regions 15 and 16, respectively. During the formation, by forming the wiring 42 inwardly compared with the upper electrode 27, it is possible to minimize the influence of a parasitic capacitance caused by the wiring 42. In addition, each of the wirings 44 and 45 for taking out the upper electrodes is set to have a minimum width in a design rule, thereby minimizing the influence of a parasitic capacitance. Thereafter, using a known wiring process, the wirings are processed.

As stated so far, as the first and second MIS capacitors 2 and 3, two types of MIS capacitors having different capacitance values per unit area, i.e., the second MIS capacitor (or MIS capacitor using the silicon nitride film of 40 nm in thickness as the dielectric film) 3 having the conventional structure having a capacitance value per unit area of 1.6 fF/µm² and the first MIS capacitor (or MIS capacitor using the silicon oxide film of 150 nm in thickness and the silicon nitride film of 40 nm in thickness as the dielectrics) 2 having a capacitance value per unit area of 0.2 fF/µm² can be formed simultaneously.

According to the above-stated semiconductor device manufacturing method, since the dielectric film 24 of the first MIS capacitor 2 is formed out of the first insulating film 21 and the second insulating film 23, the dielectric film 24 can be made thick. Besides, the second insulating film 23 is formed out of, for example, a silicon nitride film and the first insulating film 21 is formed out of a silicon oxide layer having a lower dielectric constant than that of the second insulating film, whereby a capacitance value per unit area is lowered, an MIS capacitor area is increased and a peripheral length to area ratio in a low capacitance region is made low. Additionally, since the capacitance value is determined according to the area of the upper electrode 27 (or conductive material film 26) of the first MIS capacitor 2, a parasitic capacitance generated on the peripheral portion is reduced per se.

By employing the above-stated manufacturing method, a highly accurate MIS capacitor corresponding to a low capacitance region of about 10 fF to 100 fF is manufactured. In addition, since the silicon nitride film used for the conventional MIS capacitor is used as a part of the dielectric film, the MIS capacitor is expected to have a film property, influencing the reliability of the MIS capacitor, equivalent to or higher than that of the conventional MIS capacitor. Besides, the MIS capacitor can be formed by an ordinary bipolar transistor process without increasing the number of manufacturing steps.

According to the semiconductor device stated above, the dielectric film of the first MIS capacitor is formed out of the first insulating film and the second insulating film to thereby make the dielectric film thick, to lower a capacitance value per unit area, to increase an MIS capacitor area and to make a peripheral length to area ratio in the low capacitance region low. In addition, since the capacitance value of the first MIS capacitor is determined according to the formation area of the conductive material film serving as the upper electrode, the MIS insulator capacitor can correspond to a low capacitance region having a required capacitance value of about 100 fF or less. Besides, since a parasitic capacitance generated on the peripheral portion is reduced per se, the insulator capacitor is highly accurate and excellent in reliability. Moreover, since the silicon nitride film used for the conventional MIS capacitor is used as a part of the dielectric film, it is expected that the insulator capacitor has a film property, which influences the reliability of the MIS capacitor, equivalent to or higher than that of the conventional MIS capacitor.

According to the semiconductor device manufacturing method of the present invention, the first insulator capacitor corresponding to a low capacitance region having a required capacitance value of about 100 fF or less can be formed while ensuring high accuracy and excellent reliability. In addition, since there is no need to add a new step to the step of forming the second insulator capacitor so as to form the first insulator capacitor, no process load is generated.

According to the present invention, it is possible to provide a semiconductor device having an MIS capacitor having a high capacitance value (e.g., in a region having a capacitance value exceeding 100 fF) and an MIS capacitor having a low capacitance value (e.g., in a region having a capacitance value of 100 fF or less) mounted on a common semiconductor substrate. In this connection, it is possible to manufacture a semiconductor device of this type while suppressing the occupied area of each MIS capacitor to be small within a predetermined allowable range of an integrated circuit and suppressing the unevenness of capacitance values within a practicable range, without increasing the number of manufacturing steps.

DESCRIPTION OF REFERENCE NUMERALS

1 . . . substrate
2 . . . first insulator capacitor
3 . . . second insulator capacitor
11 . . . semiconductor substrate
12 . . . epitaxial layer
13 . . . LOCOS
14 . . . device isolation diffusion layer
15 . . . first conductive material region
16 . . . second conductive material region
21 . . . first insulating film
22 . . . opening portion
23 . . . second insulating film (silicon nitride film)
24 . . . dielectric film
25 . . . dielectric film
26 . . . conductive material film
27, 28 . . . upper electrode
31 . . . interlayer insulating film (silicon oxide film)
32, 33, 34, 35 . . . opening portion
44, 45 . . . wiring

What is claimed is:

1. A method of manufacturing a semiconductor device comprising the steps of:

forming a first insulator capacitor and a second insulator capacitor on a semiconductor substrate, the first insulator capacitor and the second insulator capacitor having different unit capacitance values;

doping said semiconductor substrate with impurities, and forming a first conductive material region and a second conductive material region;

forming a first insulating film on said first conductive material region and said second conductive material region, the first insulating film serving as both an interlayer insulating film and a dielectric film of the first insulator capacitor;

forming an opening portion of said first insulating film on the second conductive material region;

forming a second insulating film on said first insulating film and in said opening portion, the second insulating film serving as both a part of the dielectric film of said first insulator capacitor and a dielectric film of said second insulator capacitor; and forming a conductive material film on said second insulating film, the conductive material film serving as an upper electrode of said first insulator capacitor and an upper electrode of said second insulator capacitor, and characterized in that a capacitance of said first insulator capacitor is determined by a formation area of said conductive material film.

2. The semiconductor device manufacturing method according to claim 1, characterized in that:

said first insulating film is formed out of a single or a plurality of silicon oxide films; and said second insulating film is formed out of a silicon nitride film.

* * * * *